United States Patent
Hofmann et al.

(10) Patent No.: US 7,060,558 B2
(45) Date of Patent: Jun. 13, 2006

(54) METHOD FOR FABRICATING A FIELD-EFFECT TRANSISTOR HAVING A FLOATING GATE

(75) Inventors: Franz Hofmann, München (DE); Georg Tempel, Sterrebeek (BE); Robert Strenz, Dresden (DE); Robert Wiesner, Regensburg (DE)

(73) Assignee: Infineon Technologies AG, Munich (DE)

( * ) Notice: Subject to any disclaimer, the term of this patent is extended or adjusted under 35 U.S.C. 154(b) by 128 days.

(21) Appl. No.: 10/320,950

(22) Filed: Dec. 16, 2002

(65) Prior Publication Data

US 2003/0119261 A1  Jun. 26, 2003

Related U.S. Application Data

(63) Continuation of application No. PCT/EP01/06407, filed on Jun. 6, 2001.

(30) Foreign Application Priority Data

Jun. 14, 2000  (DE) .............................. 100 29 287

(51) Int. Cl.
- H01L 21/336 (2006.01)
- H01L 21/425 (2006.01)
- H01L 21/3205 (2006.01)
- H01L 21/44 (2006.01)
- H01L 21/469 (2006.01)

(52) U.S. Cl. ................... 438/257; 438/659; 438/766; 438/595; 438/528

(58) Field of Classification Search ................ 438/659, 438/766, 595, 528, 517, 514
See application file for complete search history.

(56) References Cited

U.S. PATENT DOCUMENTS 5,847,427 A  12/1998  Hagiwara (Continued)

FOREIGN PATENT DOCUMENTS

DE  100 11 885 A1  11/2001

(Continued)

OTHER PUBLICATIONS

Kusunoki, S. et al.: "Hot-Carrier-Resistant Structure by Re-Oxidized Nitrided Oxide Sidewall for Highly Reliable and High Performance LDD MOSFETs". IEEE, 1991, pp. 649-652.

(Continued)

*Primary Examiner*—Chuong Anh Luu
(74) *Attorney, Agent, or Firm*—Laurence A. Greenberg; Werner H. Stemer; Ralph E. Locher

(57) ABSTRACT

In the course of a method for fabricating a field-effect transistor having a floating gate, a structure is formed which has uncovered sidewalls of a layer made of the material for forming the floating gate and which is exposed to an oxidizing atmosphere in order to coat the sidewalls. At the same time, other regions of the structure have an insulating oxide layer. At a point in time prior to the action of an oxidizing atmosphere, nitrogen is implanted into the material of the floating gate in a quantity that appreciably reduces the oxidation at the sidewalls thereof.

19 Claims, 5 Drawing Sheets

U.S. PATENT DOCUMENTS

| | | |
|---|---|---|
| 5,866,930 A | 2/1999 | Saida et al. |
| 5,888,870 A | 3/1999 | Gardner et al. |
| 5,923,983 A | 7/1999 | Fulford, Jr. et al. |
| 5,936,883 A | 8/1999 | Kurooka et al. |
| 5,962,914 A | 10/1999 | Gardner et al. |
| 6,001,713 A | 12/1999 | Ramsbey et al. |
| 6,069,041 A * | 5/2000 | Tanigami et al. ............ 438/261 |
| 6,323,106 B1 * | 11/2001 | Huang et al. ................ 438/433 |
| 6,362,045 B1 * | 3/2002 | Lin et al. ..................... 438/257 |

FOREIGN PATENT DOCUMENTS

JP     09 219 459 A     8/1999

OTHER PUBLICATIONS

Doyle, B. et al.: "Simultaneous Growth of Different Thickness Gate Oxides in Silicon CMOS Processing", IEEE Electron Device Letters, vol. 16, No. 7, Jul. 1995, pp. 301-302.

* cited by examiner

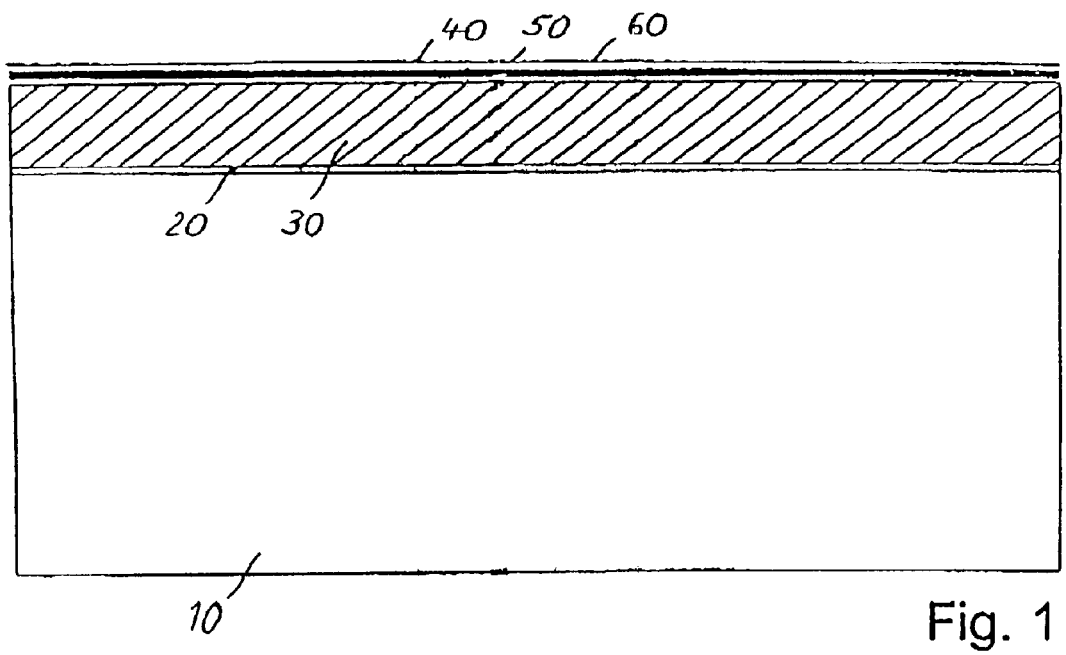
Fig. 1
Prior Art
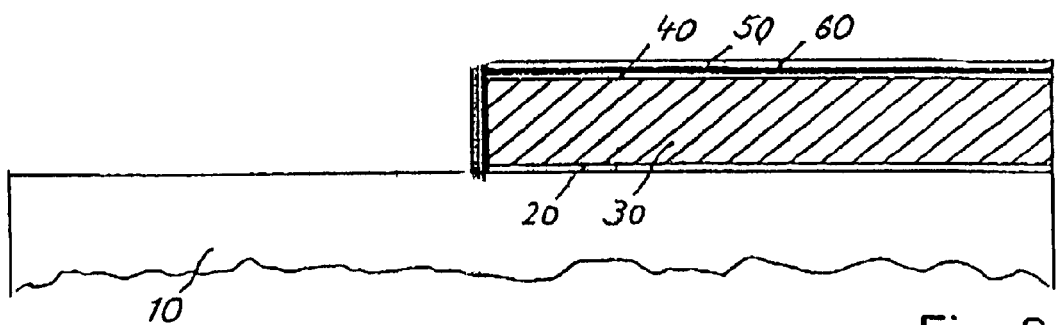
Fig. 2
Prior Art
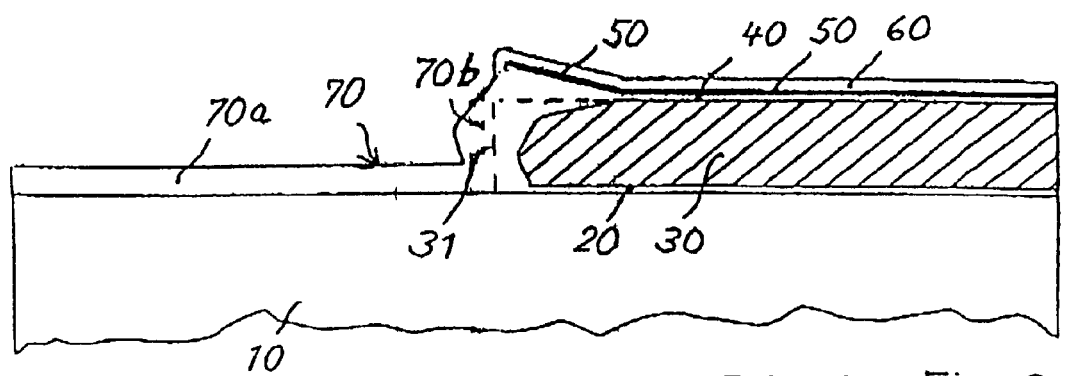
Prior Art  Fig. 3

METHOD FOR FABRICATING A FIELD-EFFECT TRANSISTOR HAVING A FLOATING GATE

CROSS-REFERENCE TO RELATED APPLICATION

This application is a continuation of copending International Application No. PCT/EP01/06407, filed Jun. 6, 2001, which designated the United States and was not published in English.

BACKGROUND OF THE INVENTION

Field of the Invention

The invention relates to a method for fabricating a field-effect transistor having a floating gate. Transistors of the generic type contain a control gate above an insulating layer on the surface of a semiconductor substrate in a region of defined geometry that extends from the source to the drain. The floating gate extends in a partial region below the control gate and is insulated all around. In such field-effect transistors, electrical charge can be stored over a very long time of the order of magnitude of years; their preferred field of use, therefore, is programmable and reprogrammable semiconductor read-only memories.

In the case of a conventional fabrication method for field-effect transistors having a floating gate, first a first layer sequence is constructed on a part of the substrate surface, which layer sequence has, at the very bottom, a thin dielectric layer as a tunnel dielectric for the floating gate (preferably an oxide layer as so-called "tunnel oxide"), above that a layer made of the material of the floating gate and, at the very top, a layer with a good dielectric property in order to form the dielectric for the so-called coupling capacitance between the control gate and the floating gate. The last-mentioned layer, which shall hereinafter be referred to as a "coupling dielectric" for short, preferably contains a nitride layer between two thin oxide layers. The combined oxide-nitride-oxide layer, usually referred to as "ONO" layer, is extremely thin in order to obtain a high coupling capacitance. The entire first layer construction is patterned by photolithographic etching technology in such a way as to produce sidewalls that define parts of the final contour of the floating gate. Afterward, at least that remaining part of the substrate surface over which the control gate is intended to extend, and the above-mentioned sidewalls of the first layer construction are oxidized in order to produce the control gate insulating layer ("high-voltage gate oxide") on the part of the substrate surface and to form the edge insulation of the floating gate at the sidewalls. The material of the control gate is applied thereon, and, after the patterning of the entire layer construction thus formed to the desired contour of the control gate, a post-oxidation of the surfaces including the sidewalls of the layer construction takes place. The selective doping of the substrate in order to form the source and drain zones is effected partly before and partly after the post-oxidation.

It has been observed that, in the course of this method, the material of the floating gate below the edge regions of the coupling dielectric is oxidized to give a form that recalls the shape of a bird's beak. The bird's beaks, made of an oxide that has formed, increase a distance between the remaining material of the floating gate and the control gate and additionally bend the edges of the coupling dielectric upward. They arise to a particularly pronounced extent where the sidewalls of the floating gate are oxidized before the application of the control gate material. The coupling dielectric is thickened at these points, since the distance between the underside of the subsequently applied control gate material and the material of the floating gate is additionally increased as a result of this. However, similar bird's beaks also arise during the later post-oxidation, to be precise where the coupling dielectric and the floating gate reach the outer sidewall after the patterning of the overall layer construction. Owing to the comparatively smaller thickness of the post-oxidation, the bird's beak formation is less pronounced, however, at this point.

The above-described bird's beak effect reduces the coupling capacitance between the control gate and the floating gate in an undesirable manner. In order to compensate for this disadvantage, hitherto the horizontal extent of the floating gate and of the overlying coupling dielectric has been enlarged and the "cell area" has thus been made larger than would actually be desirable.

SUMMARY OF THE INVENTION

It is accordingly an object of the invention to provide a method for fabricating a field-effect transistor having a floating gate that overcomes the above-mentioned disadvantages of the prior art methods of this general type, which increases the coupling capacitance between the control gate and the floating gate in the field-effect transistor without enlarging the area extent of the structure forming the capacitance.

With the foregoing and other objects in view there is provided, in accordance with the invention, a method for fabricating a field-effect transistor having a floating gate. The method contains the steps of providing a semiconductor substrate having a surface, and forming a layer construction on a part of the surface of the semiconductor substrate. The layer construction contains, as a bottommost layer, a tunnel dielectric for the floating gate, above that an intermediate layer made of a material of the floating gate and, as a topmost layer, a coupling dielectric having a nitride layer. After an application of the nitride layer of the coupling dielectric, nitrogen is implanted into the material of the floating gate in a quantity for appreciably reducing oxidation at sidewalls of layer construction. The nitrogen is implanted through the nitride layer into the material of the floating gate. The layer construction is patterned to form the sidewalls defining part of a contour of the floating gate and results in a patterned layer construction. Subsequently, a remaining part of the substrate surface and the sidewalls of the layer construction are coated with an oxide layer through an action of an oxidizing atmosphere. Subsequently, a further material for forming a control gate is applied. A geometry of an overall layer construction formed of the patterned layer construction and the further material for forming the control gate is patterned to a desired contour resulting in a patterned overall layer construction. A post-oxidation of all surfaces including the sidewalls of the patterned layer construction is performed resulting in a post oxide.

Accordingly, the principle of the invention relates to implanting nitrogen into the material of the floating gate before the initial oxidation of the sidewalls of the layer construction containing the material. The implanted nitrogen inhibits the formation of the capacitance-reducing bird's beaks, because the nitrogen acts as oxidation inhibitor in the material of the floating gate.

In accordance with an added mode of the invention, for fabricating the coupling dielectric, there is the step of forming, on a top side of the intermediate layer composed of the material of the floating gate, first a lower oxide layer, second the nitride layer and third an upper oxide layer.

In accordance with an additional mode of the invention, there is the step of performing the implanting of nitrogen step before an application of the upper oxide layer.

In accordance with another mode of the invention, there is the step of performing the implanting of nitrogen step before the patterning of the sidewalls of the layer construction.

In accordance with a further mode of the invention, there is the step of forming the tunnel dielectric for the floating gate by oxidation of the surface of the semiconductor substrate before applying the material of the floating gate.

In accordance with a further added mode of the invention, there are the steps of patterning a source end of the overall layer construction by selective etching, implanting a source doping, patterning a drain end of the overall layer construction by selective etching, performing a post-oxidation of surfaces of the semiconductor substrate uncovered by the patterning of the source end and of the drain end and of all surfaces including the sidewalls of the patterned overall layer construction, removing the post-oxide at a surface of the semiconductor substrate in a region of a drain to be formed, and implanting a drain doping in the region of the drain.

In accordance with further additional mode of the invention, there is the step of using monocrystalline silicon as the semiconductor substrate, using a doped polycrystalline silicon as the material for the floating gate and as the further material for the control gate, and using silicon nitride for forming the nitride layer.

With the foregoing and other objects in view there is provided, in accordance with the invention, a method for fabricating a field-effect transistor having a floating gate. The method includes the steps of providing a semiconductor substrate having a surface, and forming a layer construction on a part of the surface of the semiconductor substrate. The layer construction contains, as a bottommost layer, a tunnel dielectric for the floating gate, above that an intermediate layer made of a material of the floating gate and, as a topmost layer, a coupling dielectric having a nitride layer.

The layer construction is patterned for forming sidewalls defining part of a contour of the floating gate and resulting in a patterned layer construction. The patterning is performed with a selective etching to a final depth reaching at least as far as a lower end of the material of the floating gate. Nitrogen is implanted into the material of the floating gate in a quantity for appreciably reducing oxidation at the sidewalls. The nitrogen is implanted into a sidewall of the material of the floating gate uncovered by the selective etching. A remaining part of the substrate surface and the sidewalls of the layer construction are coated with an oxide layer through an action of an oxidizing atmosphere. Subsequently, a further material for forming a control gate is applied. A geometry of an overall layer construction formed of the patterned layer construction and the further material for forming the control gate is patterned to a desired contour resulting in a patterned overall layer construction. Finally, a post-oxidation of all surfaces including the sidewalls of the layer construction is performed resulting in a post oxide.

In accordance with an added mode of the invention, there is the step of performing the implanting of the nitrogen step after a first portion of the selective etching has been performed.

In accordance with another mode of the invention, during the implanting of the nitrogen step, a region of the layer construction that was omitted from the selective etching is shielded with a mask.

In accordance with a further mode of the invention, there is the step of performing the implanting of the nitrogen obliquely with respect to planes of layers and the sidewalls of the layer construction.

In accordance with a concomitant mode of the invention, there is the step of performing the implanting of the nitrogen after a first portion of the selective etching has been performed and reaches down to approximately half of the final depth.

Other features which are considered as characteristic for the invention are set forth in the appended claims.

Although the invention is illustrated and described herein as embodied in a method for fabricating a field-effect transistor having a floating gate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 5 are diagrammatic, sectional views of structures which arise one after the other in the case of a conventional method;

DESCRIPTION OF THE PREFERRED EMBODIMENTS

Figure 4:
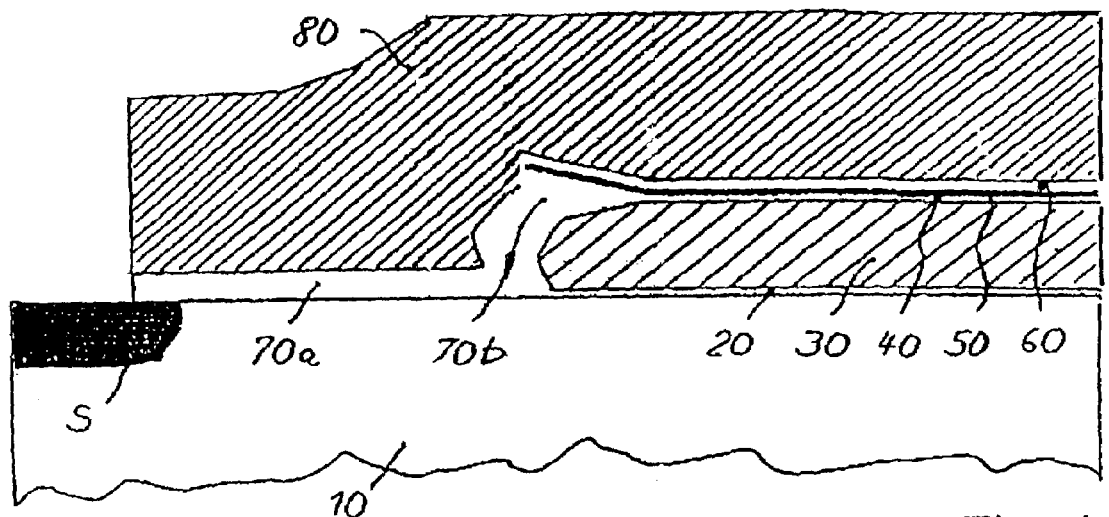

The structures shown in the figures are drawn approximately true to scale. All the figures have the same scale and show views in each case in the same vertical sectional plane, which is placed such that it passes through the regions of source and drain of a field-effect transistor to be formed.

Referring now to the figures of the drawing in detail and first, particularly, to FIG. 1 thereof, there is shown, in the case of a conventional method, a very thin first oxide layer 20 ($SiO_2$ in the exemplary case mentioned) that is produced on a substrate 10, which is composed e.g. of p-doped monocrystalline silicon (monosilicon), by oxidation of a substrate surface. The layer 20 is later intended to form a tunnel dielectric (tunnel oxide) for the floating gate and is dimensioned e.g. to a thickness of about 8 to 10 nm. A significantly thicker layer 30 of a material for the floating gate is deposited above the oxide layer 20. In the example described here, polycrystalline silicon (polysilicon) is involved, which is doped in situ with an n-type impurity (e.g. arsenic or phosphorus). Afterward, a thin so-called ONO layer, i.e. a combined oxide-nitride-oxide layer, containing a lower oxide layer 40 ($SiO_2$, about 5 nm), an overlying nitride layer 50 (e.g. silicon nitride $Si_3N_4$, about 5 nm) and an upper oxide layer 60 ($SiO_2$, about 5 nm), is formed on the surface of the polysilicon layer 30. The ONO layer 40–60 forms an outstanding dielectric for a coupling capacitance between the control gate and the floating gate of the field-effect transistor to be fabricated.

Afterward, in accordance with FIG. 2, a first patterning of the construction containing the layers 20–60 is effected, so that its horizontal extent is limited to the line which describes the floating gate contour that is later overhung by the control gate. Customary photolithography is preferably employed for this purpose, in order to etch away the layer construction regions to be removed selectively as far as the substrate, but at least down to the plane of the tunnel oxide layer. This is done, as is generally customary, using a mask layer which is produced from photoresists and which shields that region of the layer construction 20–60 that is to be left from the etchant, and is removed (stripped) after the etching operation.

The construction patterned in accordance with FIG. 2 is subsequently exposed to an oxidizing atmosphere in order to coat etched regions with an oxide layer 70. The oxidation is controlled in such a way that the oxide layer 70 grows in its region 70a above the region of the substrate 10 to a thickness that corresponds to the desired thickness (e.g. 30 nm) of the "high-voltage gate oxide", i.e. the insulating layer between the control gate and the substrate of the field-effect transistor to be fabricated. The oxide layer 60 already present above the nitride layer 50 also grows somewhat, but to a far lesser extent because the nitride is difficult to oxidize. On the other hand, the oxide growth in a region 70b at a sidewall of the layer construction 20–60 is to an extremely high degree, in particular if the material 30 of the floating gate that is uncovered there is composed of doped polysilicon. As a result of this, the material 30 is extensively oxidized at the sidewall and at the adjacent edges, as shown by a comparison with the original contour, which is depicted by a broken line 31 in FIG. 3. The oxidation forms, in particular at the upper edge of the material 30, so-called "bird's beaks" made of oxide which extend in a wedge-shaped manner into the region below the nitride layer 50 and bend the layer together with the upper oxide layer 60 upward.

The construction illustrated in FIG. 4 is then formed from the construction shown in FIG. 3. For this purpose, first a material 80 for the control gate is deposited, e.g. polysilicon, which is doped in situ with an n-type impurity. An outer contour of the material 80, where it overhangs the sidewalls of the floating gate, is then limited to the desired contour form of the control gate (that is to say with the exception of the right-hand edge, at which the drain is later formed). This is again done by photolithographic etching technology. The applied photoresist mask covering all regions with the exception of the region to be etched and being stripped again after the etching operation. At the etched-free location of the substrate 10, a source S is formed by implantation of an n-type impurity (e.g. arsenic or phosphorous), using a new photoresist mask that covers all regions with the exception of the implantation location and is then stripped again.

Figure 5:
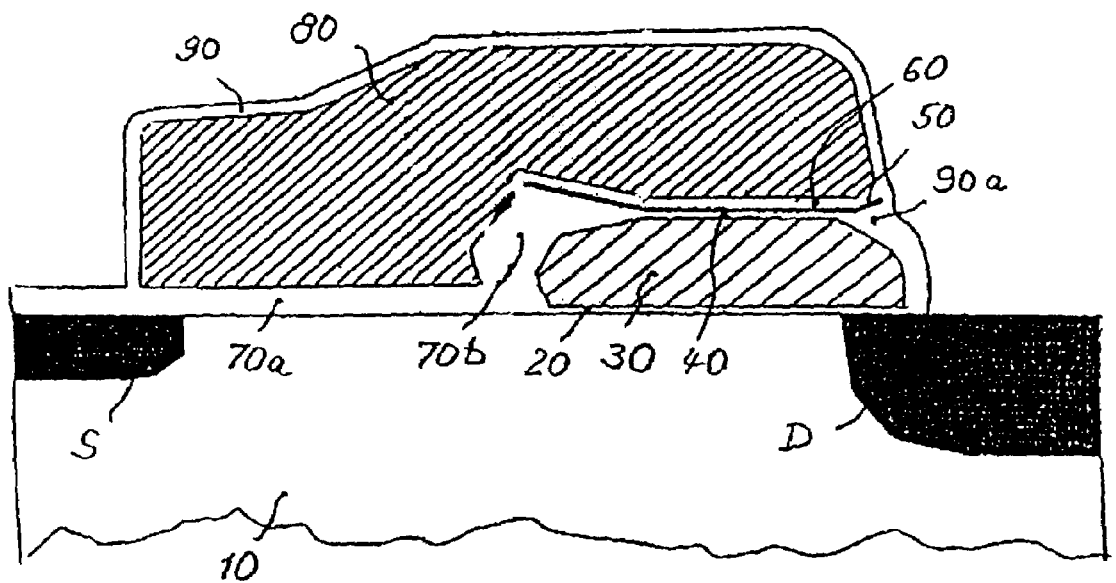

The construction according to FIG. 4 is processed further in order to attain the construction according to FIG. 5. Specifically, using a photoresist mask that shields all regions with the exception of the region provided for the drain, the layer construction 20–80 is etched away in the region (on the right in the drawing) as far as the substrate 10. After the resist has been stripped, the surface of the resulting topography is oxidized in order to coat everything with an oxide layer 90. This so-called "post"-oxidation oxidizes the sidewall of the floating gate to a particularly great extent, so that there, too, in a region 90a, a "bird's beak" made of oxide arises which can bend up the nitride layer 50. However, the bird's beak formation at this location is usually less pronounced than in the oxide region 70b at the inner control gate sidewalls, because the post-oxidation (e.g. 20 nm $SiO_2$ on the control gate 80) can usually be made significantly weaker than the thickness of the high-voltage gate oxide 70a (e.g. 30 nm $SiO_2$). A photoresist mask is formed again after the post-oxidation, which mask shields all regions with the exception of the region provided for the drain. Using the mask, the n-type dopant is implanted for forming the drain D.

As mentioned above, the "bird's beaks" at the oxide regions 70b and 90a of the field-effect transistor formed in the manner described above have the effect of reducing the coupling capacitance between the control gate 80 and the floating gate 30 in an undesirable manner.

In order to avoid or at least alleviate this problem, nitrogen is implanted into the material of the floating gate 30 at a suitable stage of the fabrication method according to the invention. Two different procedures for suitable nitrogen implantation are explained below.

Figure 6:
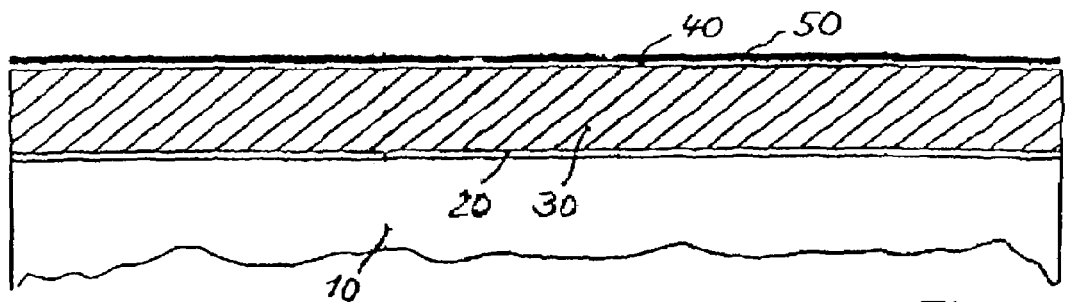
FIGS. 6 to 12 are sectional views of the structures formed of an embodiment of a method according to the invention.
Figure 7:
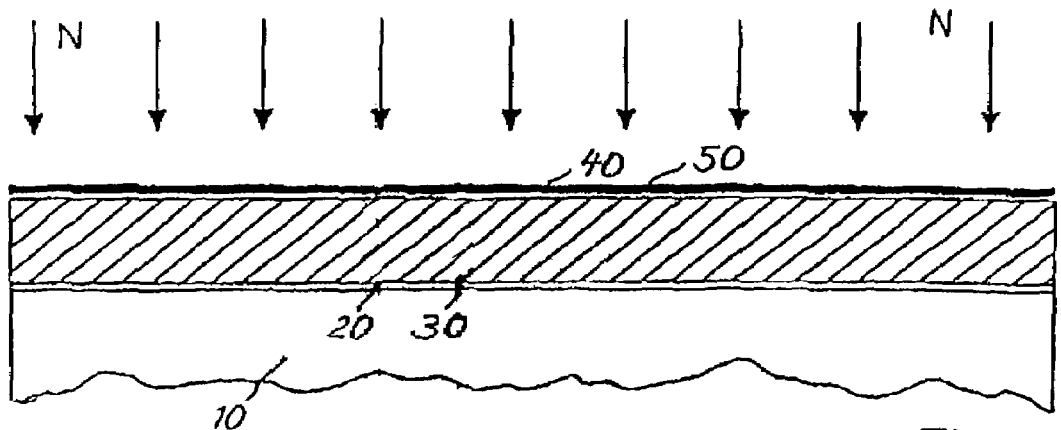

In a first embodiment, in accordance with FIG. 6, the same layer construction as shown in FIG. 1 is fabricated on the substrate 10, except that the oxidation of the nitride layer 50 in order to form the upper oxide 60 of the ONO layer to be produced does not take place for the time being. Then, in accordance with FIG. 7, nitrogen (N) is implanted perpendicularly from above into the layer 30 of the material of the floating gate, to be precise through the thin nitride layer 50 and the underlying thin oxide layer 40.

Figure 8:
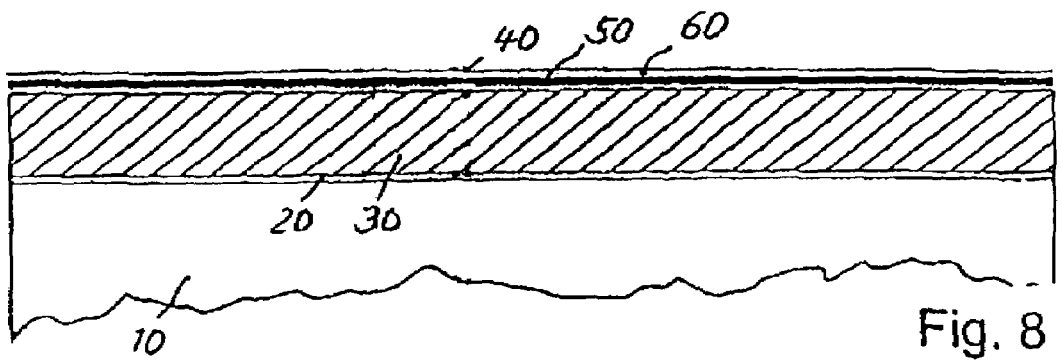

Only afterward is the surface of the nitride layer 50 oxidized in order to form the upper oxide 60 and thus to complete the ONO layer 40–60. The layer construction thus obtained is illustrated in FIG. 8 and now corresponds to that according to FIG. 1.

Figure 9:
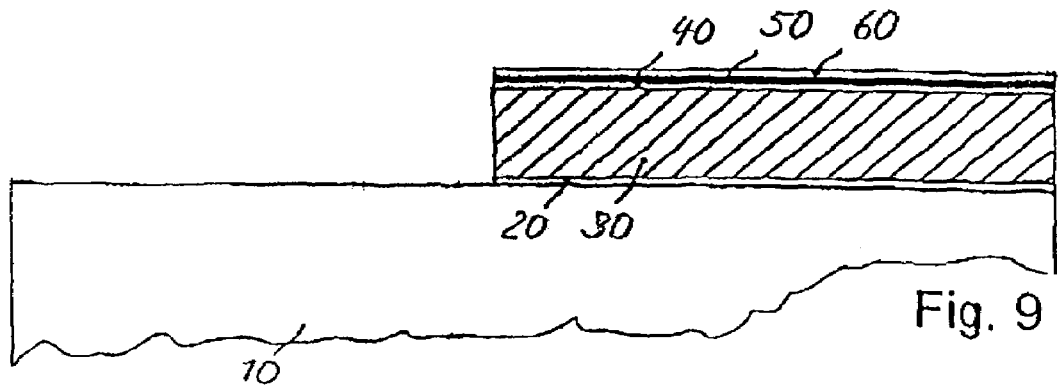
Figure 10:
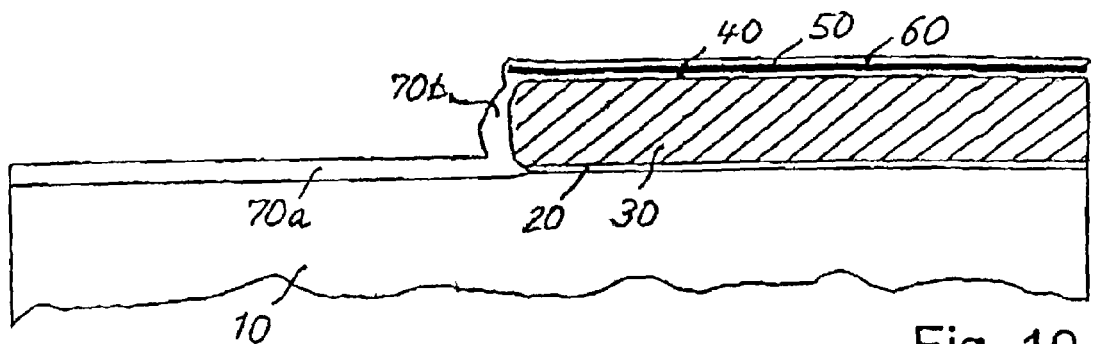

The same method steps as were described above with reference to FIGS. 2 to 5 then follow: a first photolithographic patterning is effected in order to form the structure according to FIG. 9, by carrying out the measures described above with reference to FIG. 2. Then, by the same method steps as were described above with reference to FIG. 3, the oxidation is effected in order to form the high-voltage gate oxide 70a, the oxide region 70b also being formed at the sidewall of the material 30 of the floating gate, as illustrated in FIG. 10. A comparison with FIG. 3 shows that the oxidation in the region 70b is significantly weaker owing to the oxidation-inhibiting effect of the nitrogen implanted in the material 30. In particular in the vicinity of the upper edge of the material 30, where the concentration of the nitrogen implanted from above is highest, a far lesser degree of oxidation is produced than in the case of FIG. 3. Accordingly, no (or only very weak) "bird's beaks" arise, and the nitride layer 50 is not (or only very slightly) bent upward. The nitride layer 50 itself is practically not oxidized any further at all, owing to the nitrogen also implanted there, so that the layer 60 does not become thicker at the expense of the nitride layer 50.

Figure 11:
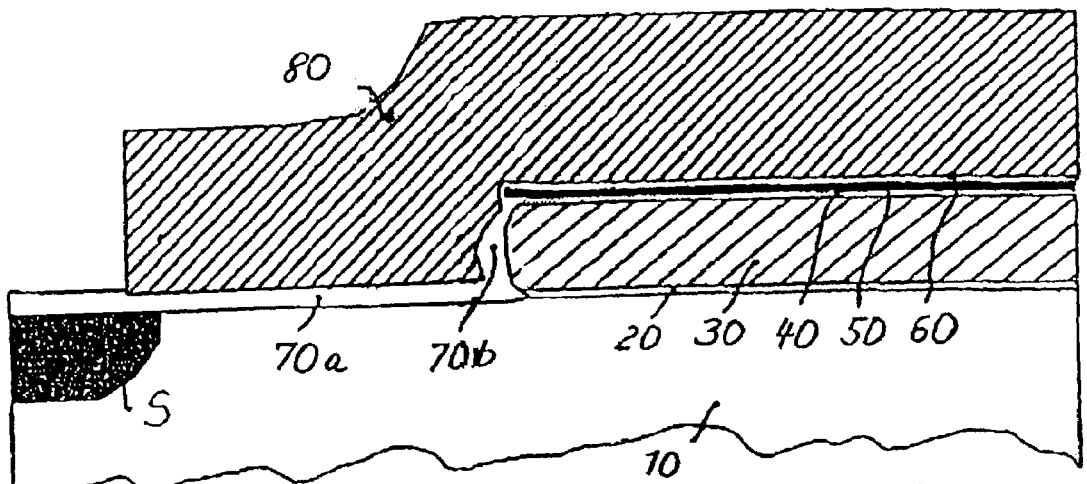

There then follows the deposition of the layer 80 for the gate oxide, the patterning of the layer 80 in order to uncover the substrate region provided for the source S, and the implantation of the source S in accordance with FIG. 11, the same method steps as were described above with reference to FIG. 4 being employed. What then take place are the renewed patterning for uncovering the region provided for the drain, the formation of the post-oxide layer 90 and the implantation of the drain in accordance with FIG. 12, the same method steps as were described above with reference to FIG. 5 being employed. A comparison of FIG. 12 with FIG. 5 shows that, in the case of FIG. 12, the bird's beak formation is significantly weaker than in the case of FIG. 5 even in the post-oxide 90 in the region 90a at the drain-end sidewall of the floating gate 30 on account of the nitrogen implantation.

Figure 13:
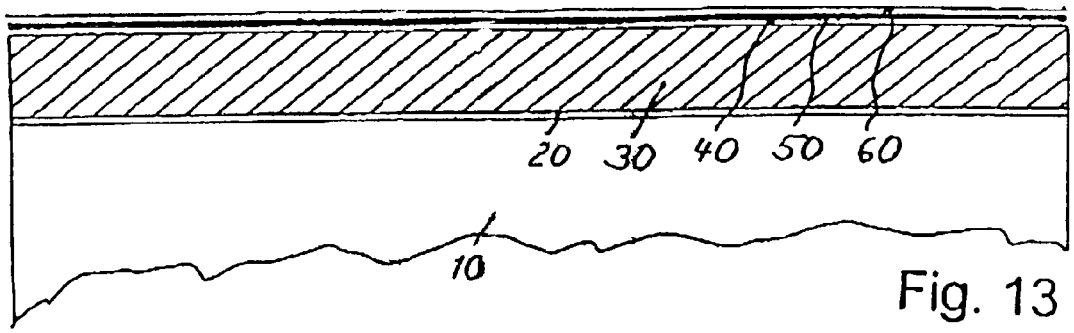
FIGS. 13 to 16 are sectional view of the structures formed for illustrating a modification of the method illustrated in FIGS. 6–12.

In a second embodiment, in accordance with FIG. 13, the same layer construction as is shown in FIG. 1, that is to say including the upper oxide 60 of the ONO layer to be provided, is fabricated on the substrate 10. Afterward, the patterning of the construction containing the layers 20–60 is begun, using the photolithographic etching method with a mask M, as was described above with reference to FIG. 2. In accordance with FIG. 14, which also shows the photoresist mask M, the etching is interrupted, however, before reaching the final etching depth, preferably upon reaching approximately half the depth. At this stage, nitrogen N is implanted obliquely from above into the partly uncovered sidewall of the material 30 of the floating gate, the top side of that region of the layer construction that is excluded from the etching being shielded by the photoresist mask M.

Figure 14:
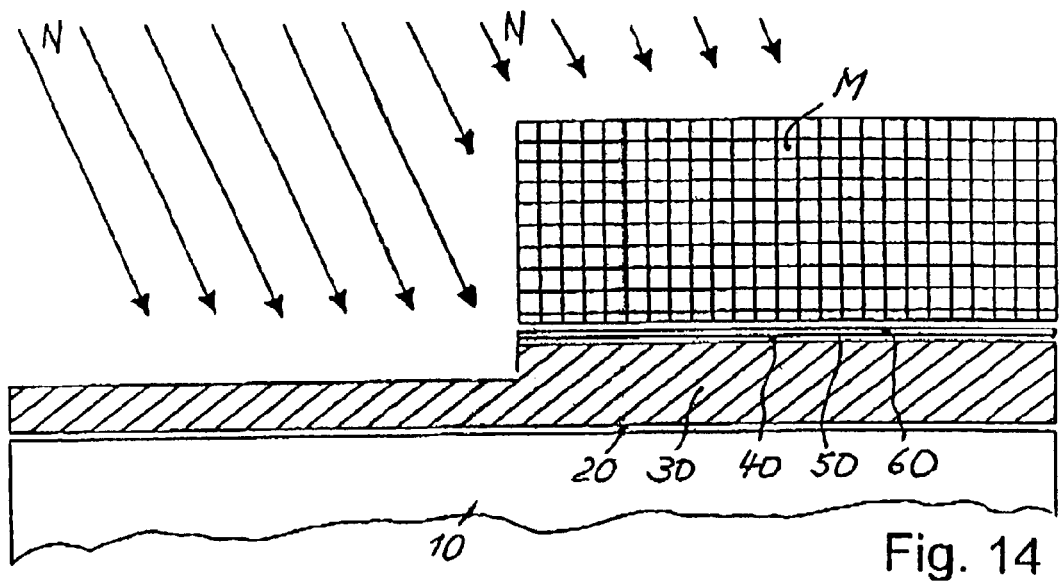
Figure 15:
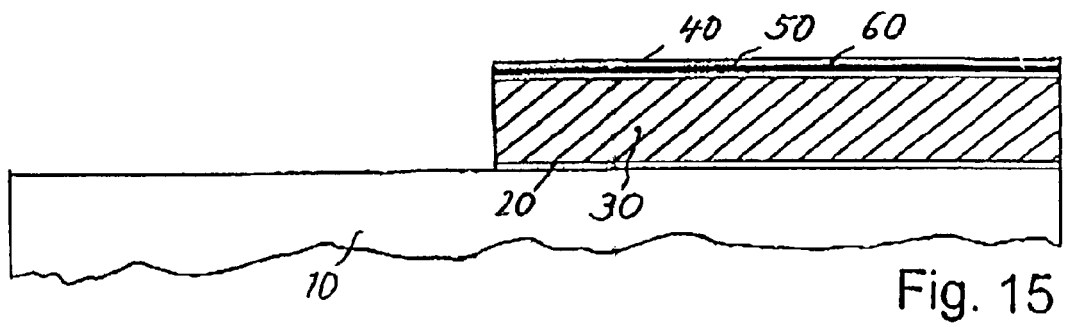
Figure 16:
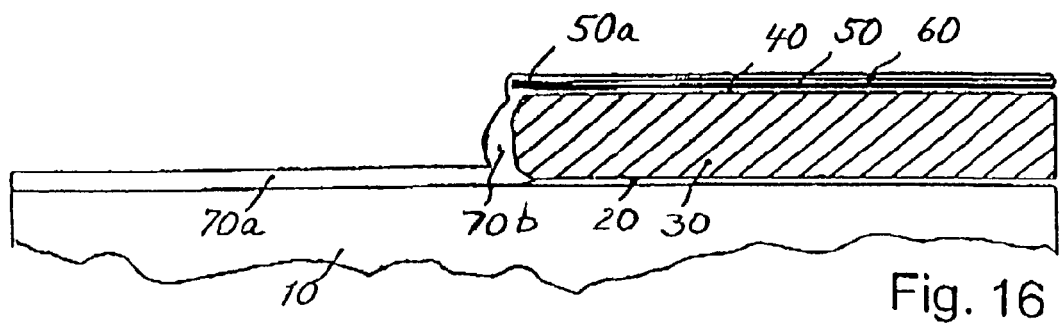

The etching is then continued down to the final depth. The structure thereby obtained is shown in FIG. 15 and corresponds to that according to FIG. 9. Proceeding from this, the oxidation is affected in order to form the high-voltage gate oxide in the region 70a and the sidewall oxide in the region 70b. This results in the construction illustrated in FIG. 16, which is like that according to FIG. 10, with similarly small bird's beak formation in the region 70b of the oxide layer 70. However, in the case of FIG. 16, the nitride layer 50 has remained at its original thickness only in a region 50a in the vicinity of its edge at the sidewall, because it is only there that the nitrogen implanted from an oblique direction has penetrated into the nitride layer 50 and develops its oxidation-inhibiting effect. Owing to the shielding mask M (FIG. 14), hardly any nitrogen was implanted in the remaining region of the nitride layer 50, so that slight oxidation of the nitride took place there and the nitride layer 50 has become somewhat thinner in this region, as shown in FIG. 16.

Figure 12:
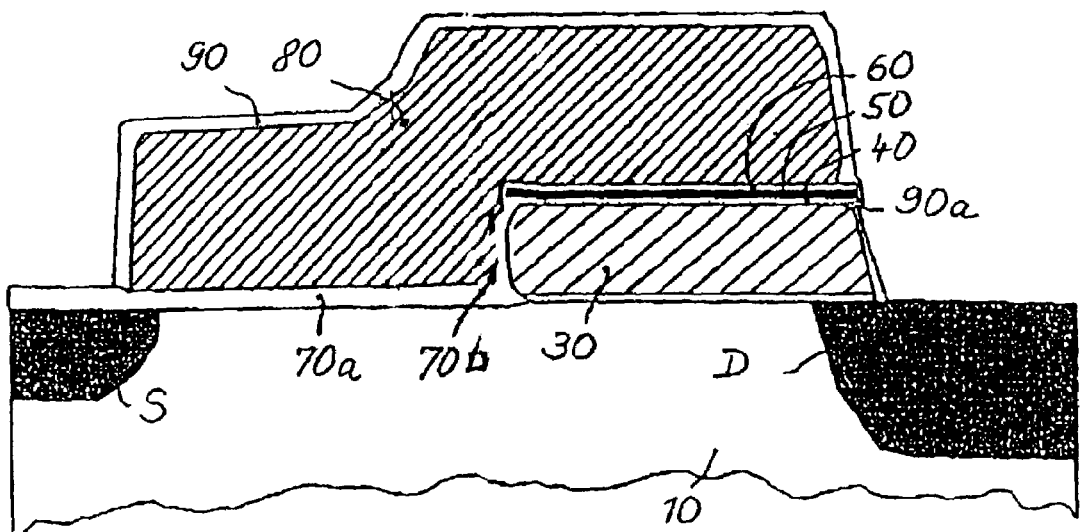

The same further treatment as was described above with reference to FIGS. 4 and 5 then takes place. The same structures as are shown in FIGS. 11 and 12 are successively produced in this case. In the region 90a of the post-oxide 90 (FIG. 12), however, the bird's beak formation is reduced to a lesser extent because the material 30 of the floating gate received less nitrogen implant at this location on account of the shielding mask M (FIG. 14).

The embodiments described above are to be understood only as examples. The invention is not restricted to the sequences of steps described. The nitrogen implantation can successfully be employed as an additional step in any desired fabrication method for field-effect transistors having a floating gate in which sidewalls of the floating gate are oxidized. The only condition is that the nitrogen implantation is effected some time prior to the oxidation and in a quantity that appreciably reduces the oxidation of the relevant sidewall.

We claim:

1. A method for fabricating a field-effect transistor having a floating gate, which comprises the steps of:
   providing a semiconductor substrate having a surface;
   forming a layer construction on a part of the surface of the semiconductor substrate, the layer construction containing, as a bottommost layer, a tunnel dielectric for the floating gate, above that an intermediate layer made of a material of the floating gate and, as a topmost layer, a coupling dielectric having a nitride layer;
   implanting, after an application of the nitride layer of the coupling dielectric, nitrogen into the material of the floating gate in a quantity for appreciably reducing oxidation at sidewalls of layer construction, the nitrogen being implanted through the nitride layer into the material of the floating gate;
   patterning the layer construction to form the sidewalls defining part of a contour of the floating gate and resulting in a patterned layer construction;
   subsequently, coating a remaining part of the substrate surface and the sidewalls of the layer construction with an oxide layer through an action of an oxidizing atmosphere;
   subsequently, applying a further material for forming a control gate;
   patterning a geometry of an overall layer construction formed of the patterned layer construction and the further material for forming the control gate to a desired contour resulting in a patterned overall layer construction; and
   performing a post-oxidation of all surfaces including the sidewalls of the patterned layer construction resulting in a post oxide.

2. The method according to claim 1, which further comprises for fabricating the coupling dielectric the step of:
   forming, on a top side of the intermediate layer composed of the material of the floating gate, first a lower oxide layer, second the nitride layer and third an upper oxide layer.

3. The method according to claim 2, which comprises performing the implanting of nitrogen step before an application of the upper oxide layer.

4. The method according to claim 1, which comprises performing the implanting of nitrogen step before the patterning of the sidewalls of the layer construction.

5. The method according to claim 1, which comprises forming the tunnel dielectric for the floating gate by oxidation of the surface of the semiconductor substrate before applying the material of the floating gate.

6. The method according to claim 1, which comprises:
   patterning a source end of the overall layer construction by selective etching;
   implanting a source doping;
   patterning a drain end of the overall layer construction by selective etching;
   performing a post-oxidation of surfaces of the semiconductor substrate uncovered by the patterning of the source end and of the drain end and of all surfaces including the sidewalls of the patterned overall layer construction;
   removing the post-oxide at a surface of the semiconductor substrate in a region of a drain to be formed; and
   implanting a drain doping in the region of the drain.

7. The method according to claim 1, which comprises using monocrystalline silicon as the semiconductor substrate.

8. The method according to claim 1, which comprises using a doped polycrystalline silicon as the material for the floating gate and as the further material for the control gate.

9. The method according to claim 1, which comprises using silicon nitride for forming the nitride layer.

10. A method for fabricating a field-effect transistor having a floating gate, which comprises the steps of:
    providing a semiconductor substrate having a surface;
    forming a layer construction on a part of the surface of the semiconductor substrate, the layer construction containing, as a bottommost layer, a tunnel dielectric for the floating gate, above that an intermediate layer made of a material of the floating gate and, as a topmost layer, a coupling dielectric having a nitride layer;

patterning the layer construction for forming sidewalls defining part of a contour of the floating gate and resulting in a patterned layer construction, the patterning being performed with a selective etching to a final depth reaching at least as far as a lower end of the material of the floating gate;

implanting nitrogen into the material of the floating gate in a quantity for appreciably reducing oxidation at the sidewalls, the nitrogen being implanted into a sidewall of the material of the floating gate uncovered by the selective etching;

coating a remaining part of the substrate surface and the sidewalls of the layer construction with an oxide layer through an action of an oxidizing atmosphere;

subsequently, applying a further material for forming a control gate;

patterning a geometry of an overall layer construction formed of the patterned layer construction and the further material for forming the control gate to a desired contour resulting in a patterned overall layer construction; and performing a post-oxidation of all surfaces including the sidewalls of the layer construction resulting in a post oxide.

11. The method according to claim 10, which comprises performing the implanting of the nitrogen step after a first portion of the selective etching has been performed.

12. The method according to claim 10, which comprises during the implanting of the nitrogen step, shielding a region of the layer construction that was omitted from the selective etching with a mask.

13. The method according to claim 10, which comprises performing the implanting of the nitrogen obliquely with respect to planes of layers and the sidewalls of the layer construction.

14. The method according to claim 10, which comprises performing the implanting of the nitrogen after a first portion of the selective etching has been performed and reaches down to approximately half of the final depth.

15. The method according to claim 10, which comprises forming the tunnel dielectric for the floating gate by oxidation of the surface of the semiconductor substrate before applying the material for forming the floating gate.

16. The method according to claim 10, which comprises:

patterning of a source end of the overall layer construction by selective etching;

implanting a source doping;

patterning a drain end of the overall layer construction by selective etching;

performing a post-oxidation of surfaces of the semiconductor substrate uncovered by patterning of the source end and of the drain end and of all surfaces including the sidewalls of the patterned overall layer construction;

removing the post-oxide at a surface of the semiconductor substrate in a region of a drain to be formed; and implanting a drain doping in the region of the drain.

17. The method according to claim 10, which comprises using monocrystalline silicon as the semiconductor substrate.

18. The method according to claim 10, which comprises using a doped polycrystalline silicon as the material for the floating gate and as the further material for the control gate.

19. The method according to claim 10, which comprises using silicon nitride for forming the nitride layer.

* * * * *